(12) United States Patent
Huang

(10) Patent No.: US 10,818,634 B2
(45) Date of Patent: Oct. 27, 2020

(54) DISPLAY PANEL, METHOD FOR MANUFACTURING THE DISPLAY PANEL, AND DISPLAY DEVICE

(71) Applicants: HKC Corporation Limited, Shenzhen, Guangdong (CN); Chongqing HKC Optoelectronics Technology Co., Ltd., Chongqing (CN)

(72) Inventor: Shishuai Huang, Guangdong (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 17 days.

(21) Appl. No.: 16/246,535

(22) Filed: Jan. 13, 2019

(65) Prior Publication Data

US 2020/0111762 A1    Apr. 9, 2020

Related U.S. Application Data

(63) Continuation of application No. PCT/CN2018/114458, filed on Nov. 8, 2018.

(30) Foreign Application Priority Data

Oct. 8, 2018   (CN) .......................... 2018 1 1171271

(51) Int. Cl.
*H01L 23/52* (2006.01)
*H01L 21/50* (2006.01)
*H01L 23/00* (2006.01)
*H05K 1/11* (2006.01)

(52) U.S. Cl.
CPC .............. *H01L 24/83* (2013.01); *H01L 24/27* (2013.01); *H01L 24/29* (2013.01); *H05K 1/117* (2013.01); *H01L 2224/27312* (2013.01); *H01L 2224/2929* (2013.01); *H01L 2224/2939* (2013.01); *H01L 2224/29339* (2013.01); *H01L 2224/29344* (2013.01); *H01L 2224/29355* (2013.01); *H01L 2224/83201* (2013.01); *H01L 2224/83851* (2013.01); *H05K 2201/10681* (2013.01)

(58) Field of Classification Search
CPC ......... H01L 24/27; H01L 24/29; H01L 24/83; H05K 1/117
USPC .......................................... 257/783; 438/118
See application file for complete search history.

(56) References Cited

U.S. PATENT DOCUMENTS 5,959,709 A * 9/1999 Asada ................. G02F 1/13452
                                                349/150
6,613,599 B2 * 9/2003 Imaeda ............... G02F 1/13452
                                                349/149

(Continued)

FOREIGN PATENT DOCUMENTS

CN         1599084 A      3/2005
CN       101252105 A      8/2008
             (Continued)

*Primary Examiner* — Luan C Thai

(57) ABSTRACT

The present disclosure provides a display panel, a method for manufacturing the display panel, and a display device. The display panel includes a substrate; a printed circuit board; a chip on film; an anisotropic conductive adhesive layer, connected between the chip on film and the substrate, and between the chip on film and the printed circuit board.

18 Claims, 7 Drawing Sheets

(56) References Cited

U.S. PATENT DOCUMENTS

| | | | | |
|---|---|---|---|---|
| 7,727,423 | B2* | 6/2010 | Yoon | ........................ H01B 1/22 |
| | | | | 252/500 |
| 9,042,108 | B2* | 5/2015 | Nobori | ................... H05K 1/147 |
| | | | | 361/749 |
| 9,406,698 | B2* | 8/2016 | Yamazaki | ............ H01L 27/1214 |
| 10,373,927 | B2* | 8/2019 | Tsukao | .................... H01L 24/14 |

FOREIGN PATENT DOCUMENTS

| | | |
|---|---|---|
| CN | 102738088 A | 10/2012 |
| CN | 204441328 U | 7/2015 |
| CN | 106486183 A | 3/2017 |
| CN | 107093592 A | 8/2017 |
| CN | 107731702 A | 2/2018 |
| JP | 2011124391 A | 6/2011 |
| KR | 100774910 B1 | 11/2007 |
| KR | 20120139115 A | 12/2012 |

* cited by examiner

DISPLAY PANEL, METHOD FOR MANUFACTURING THE DISPLAY PANEL, AND DISPLAY DEVICE

CROSS REFERENCE TO RELATED APPLICATIONS

The present application is a Continuation Application of PCT Application No. PCT/CN2018/114458 filed on Nov. 8, 2018, which claims the benefit of Chinese Patent Application No. 201811171271.8, filed on Oct. 8, 2018, which is incorporated herein by reference in its entirety.

FIELD

The disclosure generally relates to the technical field of display, and more particularly relates to a display panel, a method for manufacturing the display panel, and a display device.

BACKGROUND

Currently, in the display panel industry, the driving signal is separated from the substrate, and the driving signal is given by the integrated circuit (IC) on the printed circuit board (PCB), and the PCB is connected to the substrate through a chip on film (COF). The COF, the substrate and the PCB are etched with a plurality of electrode lines arranged in parallel, and the electrical connection between the PCB can be electrically connected to the substrate by pressing the two ends of the COF to the PCB and the substrate respectively.

It needs to adopt an anisotropic conductive adhesive film to connect the COF with the substrate. The anisotropic conductive adhesive film contains conductive particles. Currently, the anisotropic conductive adhesive film is similar to a double-sided adhesive tape. The anisotropic conductive adhesive film is rolled into a roll before using, and the anisotropic conductive adhesive film is cut into small segments when it is used. The small segment is attached on the electrode line of the COF, and then the COF and the small segment are pressed to the electrode line of the substrate.

Therefore, the current bonding mode of the anisotropic conductive adhesive film needs to be bonded twice, that is, once to COF and once to the substrate, which is a complicated process. In addition, as the anisotropic conductive adhesive film is entirety adhered to the electrode lines, there is also anisotropic conductive adhesive in gaps between adjacent electrode lines, while the anisotropic conductive adhesive at the gaps is useless, resulting in a waste of anisotropic conductive adhesive. And, due to the existence of anisotropic conductive adhesive, adjacent electrode lines are at a risk of shorting.

SUMMARY

It is therefore one main object of the present disclosure to provide a display panel, which aims to solve the technical problems of, in the display panel of an exemplary technology, a waste of anisotropic conductive adhesive, and a risk of shorting between adjacent electrode lines on the substrate.

In order to achieve the aim, the present disclosure provides a display panel, which includes: a substrate, etching and forming a plurality of first electrode lines arranged in parallel;

a printed circuit board, etching and forming a plurality of second electrode lines arranged in parallel;

a chip on film, comprising a first bonding end corresponding to the first electrode line and a second bonding end corresponding to the second electrode line; and an anisotropic conductive adhesive layer, connected between the first electrode line and the first bonding end, and between the second electrode line and the second bonding end.

Electively, the anisotropic conductive adhesive layer has a thickness of 5 micrometers and 10 micrometers.

Electively, the thickness of the anisotropic conductive adhesive is 8 micrometers.

Electively, the anisotropic conductive adhesive layer comprises a photo-curing agent.

Electively, the anisotropic conductive adhesive layer comprises a thermal curing agent.

The present disclosure also provides a method for manufacturing the display panel, which includes the following operations:

manufacturing colloidal anisotropic conductive agent;

coating the anisotropic conductive agent on each electrode line of a substrate and each electrode line of a printed circuit board, or coating the anisotropic conductive agent on two ends of a chip on film; and pressing the two ends of the chip on film with the electrode lines of the substrate and the printed circuit board respectively.

Electively, the operation of manufacturing colloidal anisotropic conductive agent comprises the following operations:

dissolving conductive particles, thermosetting resin and curing agent in a volatile solvent to obtain a conductive solution;

drying the conductive solution to obtain the anisotropic conductive agent having a certain viscosity and a colloidal shape.

Electively, through a glue coating method, coating the anisotropic conductive agent on each electrode line of the substrate and each electrode line of the printed circuit board, or coating the anisotropic conductive agent on two ends of the chip on film.

Electively, through a spraying method, coating the anisotropic conductive agent on each electrode line of the substrate and each electrode line of the printed circuit board, or coating the anisotropic conductive agent on two ends of the chip on film.

Electively, through a roller coating method, coating the anisotropic conductive agent on each electrode line of the substrate and each electrode line of the printed circuit board, or coating the anisotropic conductive agent on two ends of the chip on film.

Electively, the operation of coating the anisotropic conductive agent on each electrode line of the substrate comprises the following operations:

placing the substrate on an operation platform;

driving a glue dispensing tank of a glue dispenser to be adjacent to one of the electrode lines on the substrate;

applying a pressure to the glue dispensing tank to make the anisotropic conductive agent flow out from a glue outlet of the glue dispensing tank;

moving the substrate at a constant speed along an extending direction of the electrode line until the electrode line of the substrate is coated with the anisotropic conductive agent;

releasing the pressure applied to the glue dispensing tank and driving the glue dispensing tank away from the electrode line; and repeating the above operations until all the electrode lines on the substrate are coated with the anisotropic conductive agent.

Electively, the glue dispensing tank defines a plurality of glue outlets in parallel.

Electively, the operation of pressing the two ends of the chip on film with the electrode lines of the substrate and the printed circuit board respectively, comprises curing the anisotropic conductive agent through a photo-curing method.

The present disclosure further provides a display device, which includes a display panel, the display panel includes: a substrate, etching and forming a plurality of first electrode lines arranged in parallel;

a printed circuit board, etching and forming a plurality of second electrode lines arranged in parallel;

a chip on film, comprising a first bonding end corresponding to the first electrode line and a second bonding end corresponding to the second electrode line; and an anisotropic conductive adhesive layer, connected between the first electrode line and the first bonding end, and between the second electrode line and the second bonding end.

Electively, the anisotropic conductive adhesive layer has a thickness of 5 micrometers and 10 micrometers.

Electively, the thickness of the anisotropic conductive adhesive is 8 micrometers.

Electively, the anisotropic conductive adhesive layer comprises a photo-curing agent.

Electively, the anisotropic conductive adhesive layer comprises a thermal curing agent.

The display panel provided by the technical solution of the application includes the substrate, the printed circuit board, the crystal chip on film, and the anisotropic conductive adhesive layer, the plurality of first electrode lines arranged in parallel are etched and formed on the substrate, the plurality of second electrode lines arranged in parallel are etched and formed on the printed circuit board, the chip on film includes the first bonding end corresponding to the first electrode line and the second bonding end corresponding to the second electrode line, and the anisotropic conductive adhesive layer is connected between the first electrode line and the first bonding end, and between the second electrode line and the second bonding end. It can be understood that since the anisotropic conductive adhesive layer is only connected between the first electrode line and the first bonding end, and between the second electrode line and the second bonding end, there is no anisotropic conductive adhesive existed in the gaps between adjacent first electrode lines and gaps between adjacent second electrode lines. Compared with the exemplary technology, by attaching anisotropic conductive adhesive strips on the substrate and the printed circuit board, the present disclosure can not only reduce the usage amount of anisotropic conductive adhesive by nearly half, but also because there is no anisotropic conductive adhesive existed in the gaps between adjacent electrode lines, the phenomenon of shorting between adjacent electrode lines can be avoided, such the stability of the display panel is improved.

BRIEF DESCRIPTION OF THE DRAWINGS

To better illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some embodiments according to this disclosure, and that those having ordinary skill in the art will be able to obtain other drawings based on the arrangements shown in these drawings without making inventive efforts.

The realization of the aim, functional characteristics, advantages of the present disclosure are further described specifically with reference to the accompanying drawings and embodiments.

DETAILED DESCRIPTION

It is to be understood that, all of the directional instructions in the exemplary embodiments of the present disclosure (such as top, down, left, right, front, back) can only be used for explaining relative position relations, moving condition of the elements under a special form (referring to figures), and so on, if the special form changes, the directional instructions changes accordingly.

In addition, the descriptions, such as the "first", the "second" in the exemplary embodiment of present disclosure, can only be used for describing the aim of description, and cannot be understood as indicating or suggesting relative importance or impliedly indicating the number of the indicated technical character. Therefore, the character indicated by the "first", the "second" can express or impliedly include at least one character. In addition, the "and/or" in the present disclosure means including three paratactic solutions, for example, taking "A and/or B" as an example, the "A and/or B" includes A solution, B solution, or solution of A and B. In addition, the technical proposal of each exemplary embodiment can be combined with each other, however the technical proposal must base on that the ordinary skill in that art can realize the technical proposal, when the combination of the technical proposals occurs contradiction or cannot realize, it should consider that the combination of the technical proposals does not existed, and is not contained in the protection scope required by the present disclosure.

The present disclosure provides a display panel.

Figure 1:
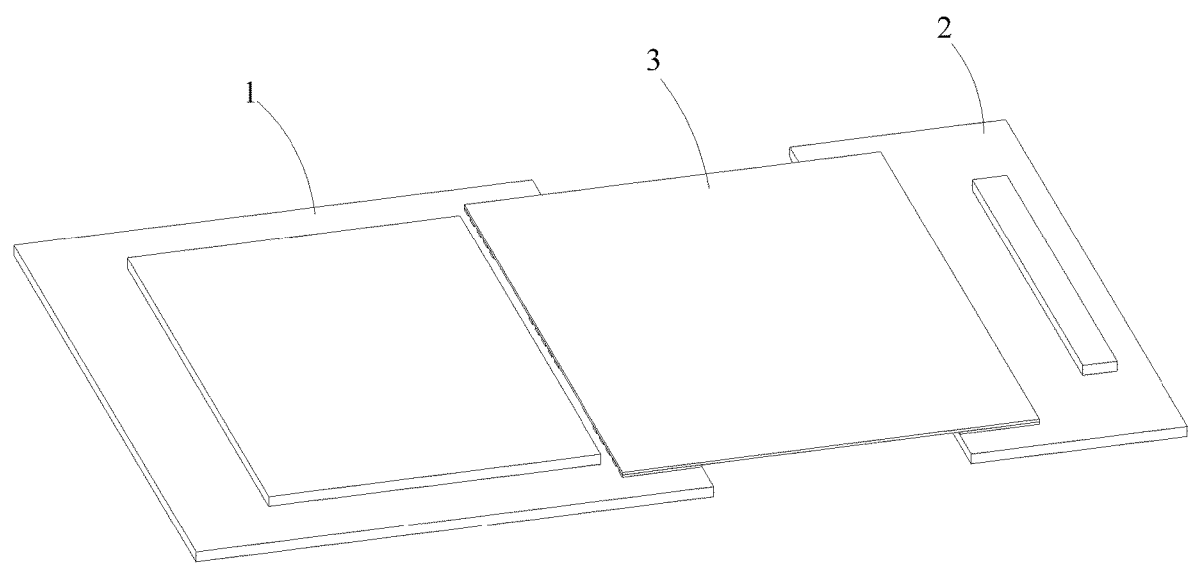
FIG. 1 is a structural diagram of the display panel of the present disclosure according to an exemplary embodiment.
Figure 2:
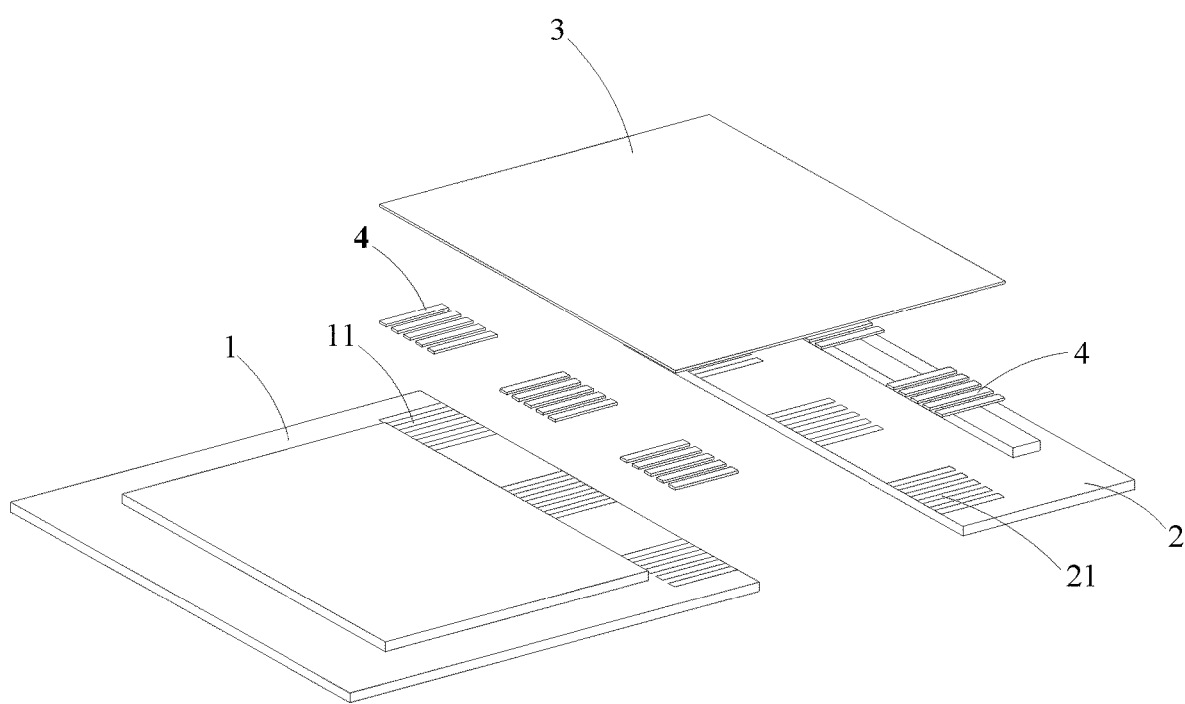
FIG. 2 is an exploded diagram of FIG. 1.

In some of the embodiments of the present disclosure, as shown in FIGS. 1 and 2, the display panel includes a substrate 1, a printed circuit board 2, a chip on film 3, and an anisotropic conductive adhesive layer 4. A plurality of first electrode lines 11 arranged in parallel are formed on the substrate 1 through etching, and a plurality of second electrode lines 21 arranged in parallel are formed on the printed circuit board 2 through etching. The chip on film 3 includes a first bonding end corresponding to the first electrode line 11 and a second bonding end corresponding to the second electrode line 21. The anisotropic conductive adhesive layer 4 is connected between the first electrode line 11 and the first bonding end, and between the second electrode line 21 and the second bonding end.

Specifically, the anisotropic conductive adhesive layer 4 is connected between the substrate 1 and the chip on film 3, and between the chip on film 3 and the printed circuit board 2 through coating. Taking a method for manufacturing a display panel as an example to illustrate: first, manufacturing a colloidal anisotropic conductive agent. Then, coating the obtained anisotropic conductive agent on the electrode lines of the substrate 1 and the printed circuit board 2, or coating the anisotropic conductive agent on two ends of the chip on film 3. Finally, the two ends of the chip on film 3 are pressed with the electrode lines of the substrate 1 and the printed circuit board 2, respectively. It can be understood that, by using the manufacturing method, the presence of anisotropic conductive adhesive layer 4 between adjacent first electrode lines 11 and between adjacent second electrode lines 21 is avoided, and the display panel of the present disclosure is obtained by setting this method as that the any substrate 1 connects with the chip on film 3, and the printed circuit board 2 connects with the chip on film 3. In some embodiments, the anisotropic conductive adhesive layer 4 is obtained by curing the anisotropic conductive agent. In other embodiments, the anisotropic conductive adhesive layer 4 can also be obtained by cutting an anisotropic conductive adhesive tape or an anisotropic conductive adhesive film.

The display panel proposed by the technical solution of the present disclosure includes the substrate 1, the printed circuit board 2, the chip on film 3, and the anisotropic conductive adhesive layer 4, the substrate 1 is etched with the plurality of first electrode lines 11 arranged in parallel, the printed circuit board 2 is etched with the plurality of second electrode lines 21 arranged in parallel, the chip on film 3 includes the first bonding end corresponding to the first electrode line 11 and the second bonding end corresponding to the second electrode line 21, and the anisotropic conductive adhesive layer 4 is connected between the first electrode lines 11 and the first bonding end, and between the second electrode lines 21 and the second bonding end. It can be understood that since the anisotropic conductive adhesive layer 4 is only connected between the first electrode lines 11 and the first bonding end, and between the second electrode lines 21 and the second bonding end, there is no anisotropic conductive adhesive in the gaps between adjacent first electrode lines 11, and gaps between the adjacent second electrode lines 21. Compared with the exemplary technology, through the mode of attaching anisotropic conductive adhesive strip on the substrate 1 and the print circuit board 2, the present disclosure can not only reduce the usage amount of anisotropic conductive adhesive by nearly half through attaching anisotropic conductive adhesive layer 4 on the electrode lines, and as there is no anisotropic conductive adhesive existed between adjacent anisotropic conductive adhesive, the shorting phenomenon of between adjacent electrode lines can be avoided, and the stability of the display panel is improved.

Furthermore, the anisotropic conductive adhesive layer 4 has a thickness of 5 micrometers to 10 micrometers.

The conductive capability of the anisotropic conductive adhesive layer 4 is realized by numerous and mutually independent conductive particles in the anisotropic conductive adhesive layer. If the conductive adhesive layer is too thick, the conductive capability of the anisotropic conductive adhesive may be limited, so that the product cannot respond to the signal in time. The anisotropic conductive adhesive also comprises an adhesive for bonding the substrate 1 and the chip on film 3, or bonding the printed circuit board 2 and the chip on film 3. If the conductive adhesive layer is too thin, the bonding stability between the chip on film 3 and the substrate 1, or between the chip on film 3 and the printed circuit board 2 may deteriorate, which may lead to a disconnection between the chip on film 3 and the substrate 1 or between the printed circuit board 2, thus failing to effectively transmit electrical signals and causing product failure. As can be understood, the reason why the thickness of the conductive adhesive layer is set as 5 micrometers to 10 micrometers in this present disclosure is that in the thickness range of 5 micrometers to 10 micrometers, the conductive ability and electrical conductivity of the anisotropic conductive adhesive reach an optimal balance, that is, the stability of the connections between the chip on film 3 and the substrate 1, and between the printed circuit board 2 and the chip on film 3 are ensured, and the conductive ability of the anisotropic conductive adhesive is also ensured.

Specifically, in some embodiments, the thickness of the anisotropic conductive adhesive layer 4 is 8 micrometers, and in other embodiments, the thickness of the anisotropic conductive adhesive layer 4 may also be 5 micrometers, 6 micrometers, 7 micrometersm, 9 micrometers or 10 micrometers.

Further, the anisotropic conductive adhesive layer 4 contains the photo-curing agent.

In general, the conventional anisotropic conductive adhesive has the thermal curing agent, and when bonding the chip on film 3 to the substrate 1 or the printed circuit board 2, the anisotropic conductive adhesive is usually cured by thermal curing, and a certain pressure is applied while heating the anisotropic conductive adhesive. However, since the electrode lines on the substrate 1 are formed by transparent conductive glass (ITO), and the heat resistance of ITO is only 120 degrees, the heat required to heat the anisotropic conductive adhesive may cause the ITO material to deform and lose its function. And, in the process of the anisotropic conductive adhesive from hot to cold, shrinkage attraction may be generated inside the anisotropic conductive adhesive, resulting in warpage, thus increasing the contact resistance of the anisotropic conductive adhesive layer 4 in the thickness direction, further resulting in a significant decrease in the contact reliability between the chip on film 3 and the substrate 1, or between the chip on film 3 and the printed circuit board 2, which is easy to cause product failure. Therefore, in the present disclosure, by adding a photo curing agent to the anisotropic conductive adhesive, the anisotropic conductive adhesive can be cured by photo curing when bonding the chip on film 3 to the substrate 1 or bonding the chip on film 3 to the printed circuit board 2, so as to avoid the problems caused by the thermal curing method and to improve the yield of the product.

Specifically, in some embodiments, the photo-curing agent contained in the anisotropic conductive adhesive is a photo-curing resin, and the photo-curing resin is one of the following materials: ethylene oxide bisphenol A dimethacrylate, diethylene glycol dimethacrylate, and polyurethane acrylic resin.

It should be noted that in other embodiments of the present disclosure, the anisotropic conductive adhesive layer 4 also includes a thermal curing agent, that is, the anisotropic conductive adhesive layer 4 can also be cured by thermal curing, specifically, the thermal curing agent is a thermal curing resin. Both thermal curing and photo-curing can realize the curing of the anisotropic conductive adhesive layer. The specific curing method needs to be properly selected according to the actual production situation.

Figure 3:
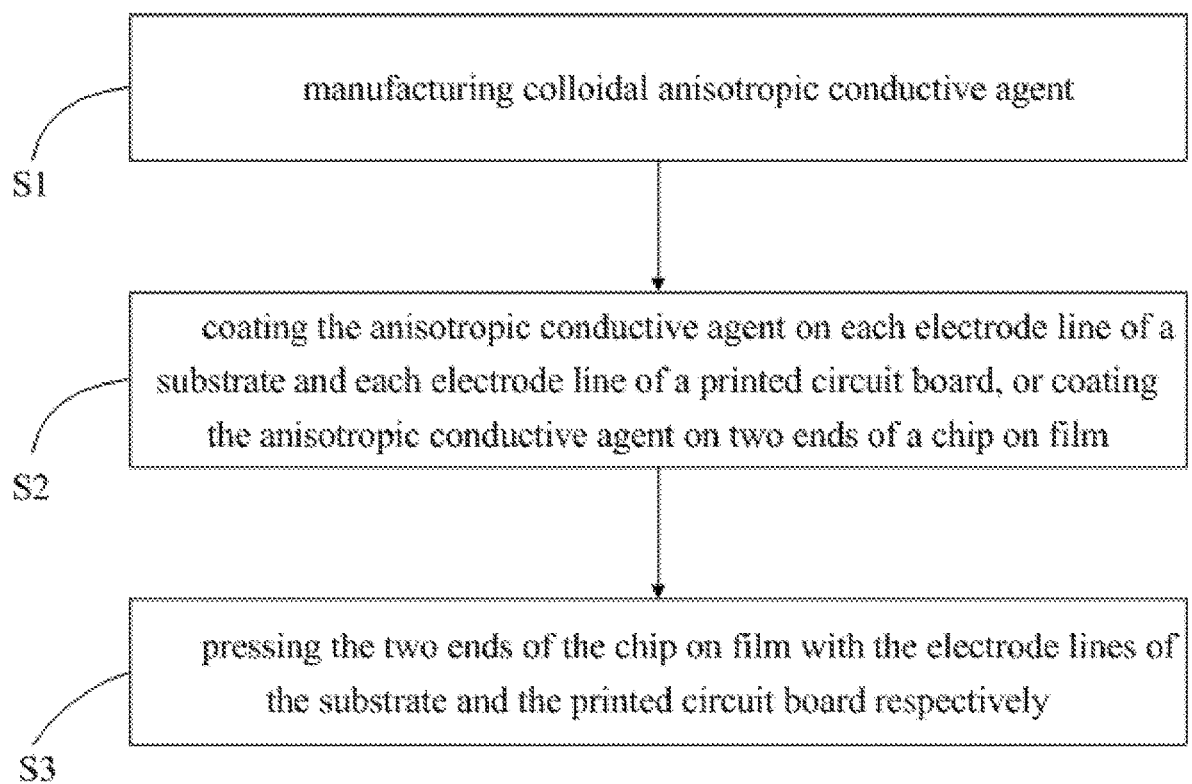
FIG. 3 is a flowchart of the method for manufacturing display panel of the present disclosure according to an exemplary embodiment.

Referring to FIG. 3, the embodiment also provides a method for manufacturing a display panel, the method includes the following operations:

S1, manufacturing colloidal anisotropic conductive agent;

It can be understood that if the anisotropic conductive agent is made into a liquid state, it is difficult to control the shape of the anisotropic conductive agent due to the fluidity of the liquid when bonding the chip on film to the substrate or when printing the circuit board, and the anisotropic conductive agent may flow out of the range of the electrode lines, resulting in the phenomenon of shorting between adjacent electrode lines. Secondly, the thickness of the anisotropic conductive adhesive layer formed after the curing of the anisotropic conductive agent, cannot be well controlled, causing the thick the anisotropic conductive adhesive layer affects the stability of the connections between the chip on film and the substrate, and between the chip on film and the printed circuit board. If the anisotropic conductive agent is prepared into a solid state, it cannot be well coated on the substrate or printed circuit board or chip on film due to the poor fluidity of the solid state. After the anisotropic conductive agent is cured, it is necessary to soften the solid anisotropic conductive agent again and then cure it again in order to successfully complete the bonding between the chip on film and the substrate, and between the chip on film and printed circuit board, it's very cumbersome to operate. Colloid is a kind of substance between liquid and solid. The purpose of manufacturing anisotropic conductive agent into colloidal form is to facilitate to coat anisotropic conductive agent on substrate, the printed circuit board or the chip on film.

S2, coating the anisotropic conductive agent on the substrate and the electrode lines of the printed circuit board, or coating the anisotropic conductive agent on two ends of the chip on film;

It can be understood that in the operation, according to the actual production process, the anisotropic conductive agent can be coated on the electrode lines of the substrate first and then be coated on the electrode lines of the printed circuit board without coating the anisotropic conductive agent on the chip on film. Or coating anisotropic conductive agent on one end of the chip on film and then coating anisotropic conductive agent on the other end of the chip on film without coating anisotropic conductive agent on the electrode lines of the substrate and the printed circuit board. It should be noted that since the chip on film is a flexible material, when the anisotropic conductive agent is applied to the chip on film, a corresponding fastener may be provided on the operation platform to fix the position of the chip on film. The fastener may be an elastic clamp whose elastic force direction is perpendicular to a table of the operation platform, or the fastener may be a pressing plate rotatably or slidably mounted on the operation platform, etc.

S3, pressing two ends of the chip on film with the substrate and the electrode line of the printed circuit board respectively.

It can be understood that S3 follows S2 and alternates with S2. According to the different coating processes in operation S2, S3 may also change accordingly. For example, if the anisotropic conductive agent is first coated on the electrode line of the substrate in S2, one end of the chip on film is first pressed onto the substrate through equipment to complete the connection between the substrate and the chip on film, then S2 is repeated, the anisotropic conductive agent is coated on the electrode line of the printed circuit board, and then the other end of the chip on film is pressed onto the printed circuit board through equipment to complete the chip on film and the printed circuit board. Of course, it is also possible to coat the anisotropic conductive agent on the electrode line of the printed circuit board first to complete the connection between the chip on film and the printed circuit board, and then coat the anisotropic conductive agent on the electrode line of the substrate to complete the connection between the chip on film and the substrate. Alternatively, the anisotropic conductive agent may be coated on one end of the chip on film to complete the connection between the chip on film and the substrate, or between the chip on film and printed circuit board, and then the anisotropic conductive agent may be coated on the other end of the chip on film.

It should be noted that in the process of pressing the substrate and the chip on film, the substrate may be pressed against the chip on film or the chip on film may be pressed against the substrate, and the specific manner is not limited, and so is the pressing between the chip on film and the printed circuit board.

Figure 4:
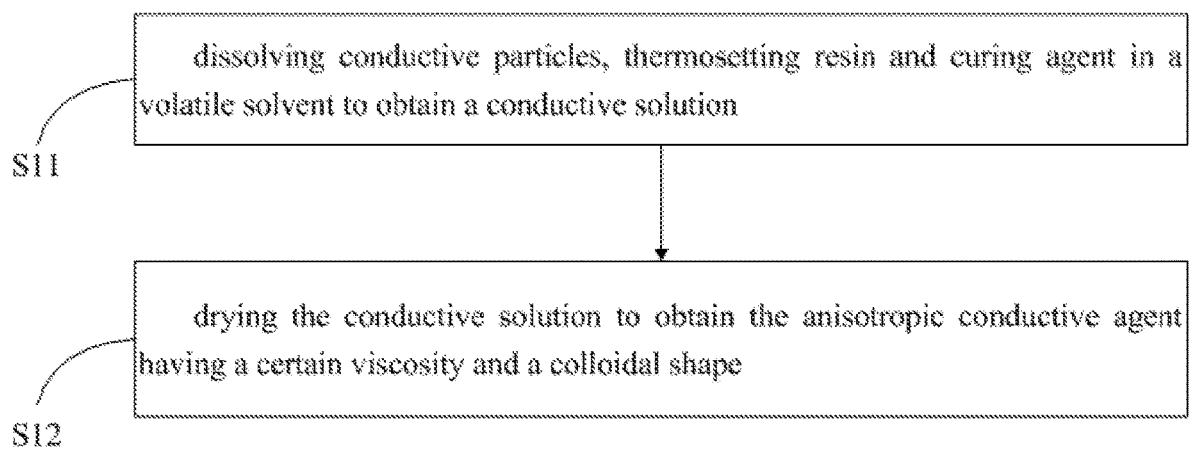
FIG. 4 is a detailed flowchart of operation S1 in the method shown in FIG. 3.

Further, as shown in FIG. 4, S1 includes the following operations.

S11: dissolving conductive particles, thermosetting resin and curing agent in a volatile solvent to obtain a conductive solution;

Specifically, the conductive particles may be metal particles such as nickel, silver, gold, etc., or styrene polymer resin particles plated with conductive metal films such as nickel, gold, etc. In some embodiments, the conductive particles are resin particles plated with gold. The volatile solvent in S11 may be toluene, butanone, etc.

S12: drying the conductive solution to obtain the anisotropic conductive agent having a certain viscosity and a colloidal shape.

Specifically, the conductive solution can be dried by baking or air drying. in some embodiments, the conductive solution is dried by air drying.

Furthermore, in some embodiments, S2 is applied by glue coating mode.

Figure 5:
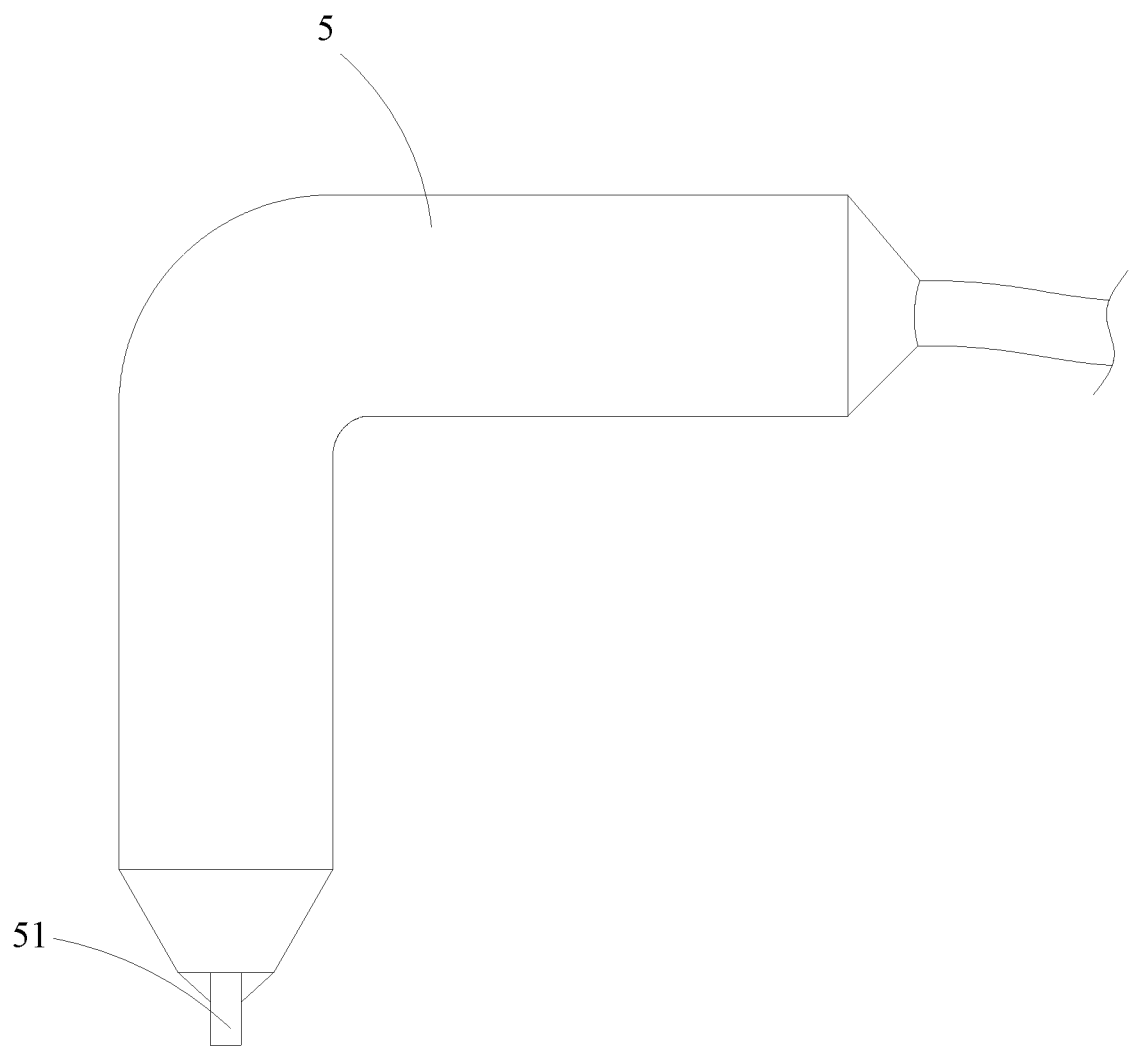
FIG. 5 is a structural diagram of the spray gun of the method for manufacturing the display panel of the present disclosure according to an embodiment.
Figure 6:
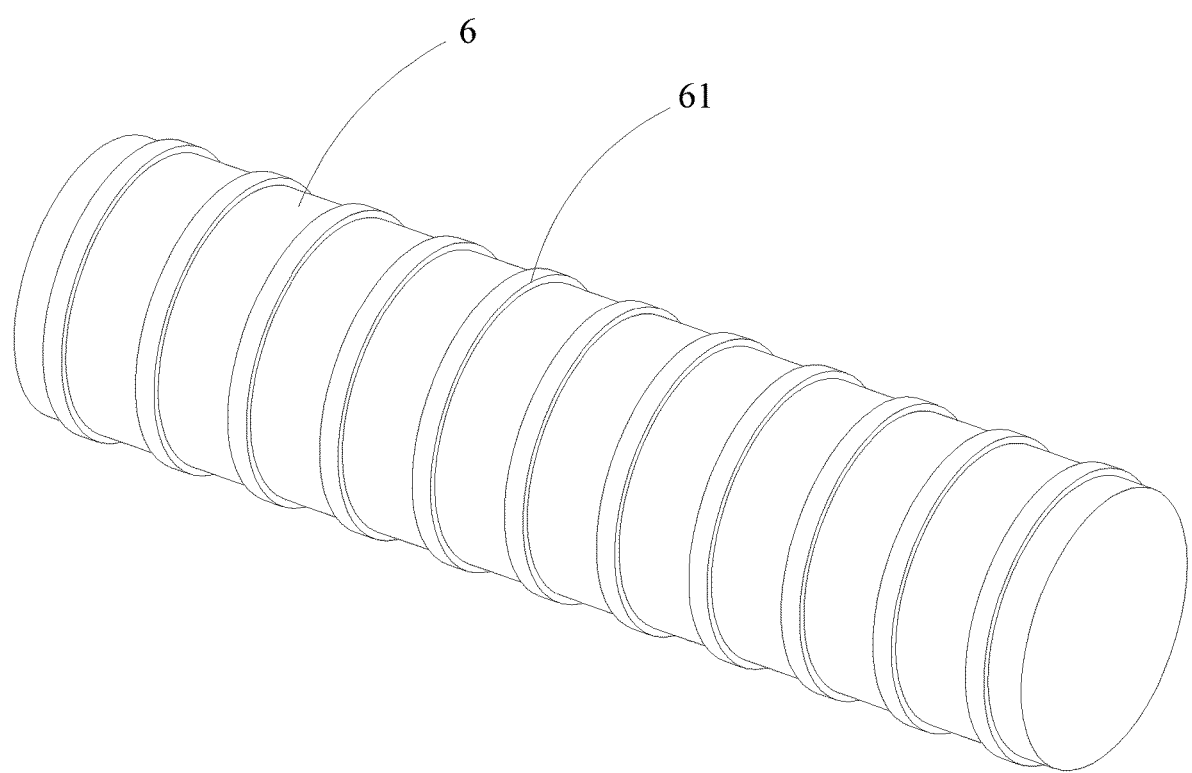
FIG. 6 is a structural diagram of the roller of the method for manufacturing the display panel of the present disclosure according to an embodiment.

It should be noted that in other embodiments, S2 may also be applied by spraying mode or roller coating mode. As shown in FIG. 5, compared with glue coating mode, the spraying method cannot control the spraying precision very well. To improve the spraying precision, a nozzle 51 of a spray gun 5 can be set to be flat, and a spraying robot (not shown) can be used to control the nozzle 51 for spraying. As shown in FIG. 6, compared with glue coating mode, the roller coating mode cannot well control the amount of spraying and may easily cause a waste of anisotropic conductive agent. In order to solve this problem, a plurality of guide posts 61 can be arranged on the roller 6, the guide posts 61 correspond to the electrode lines one by one, such the anisotropic conductive agent can be accurately coated on the substrate or printed circuit board during coating.

Specifically, the glue coating mode includes three modes: needle printing mode, injection mode, and screen printing mode. In some embodiments, the injection mode is adopted, the injection mode has the advantages of great flexibility, convenient adjustment, and no contact of glue solution with air. It will be understood that in other embodiments, the dispensing modes such as needle printing mode and screen printing mode may also be used for coating.

Furthermore, the viscosity of the anisotropic conductive agent prepared in 51 is in the range of 70 Pa·s to 100 Pa·s, and according to the experimental data, the glue solution with viscosity in the range of 70 Pa·s to 100 Pa·s is most suitable for glue coating mode by injection. Specifically, in some embodiments, the viscosity of the anisotropic conductive agent is 80 Pa·s, and in other embodiments, the concentration of the anisotropic conductive agent may also be 70 Pa·s, 75 Pa·s, 85 Pa·s, 90 Pa·s, 95 Pa·s, or 100 Pa·s, etc.

Furthermore, in some embodiments, the operation of applying the anisotropic conductive agent on the electrode line of the substrate in S2 includes the following operations:

S21, placing the substrate on an operation platform;

S22, driving a glue dispensing tank of a glue dispenser to be adjacent to one of the electrode lines on the substrate;

S23, applying a pressure to the glue dispensing tank to make the anisotropic conductive agent flow out from a glue outlet of the glue dispensing tank;

S24, moving the substrate at a constant speed along an extending direction of the electrode line until the electrode line of the substrate is coated with the anisotropic conductive agent;

S25, releasing the pressure applied to the glue dispensing tank and driving the glue dispensing tank away from the electrode line.

S26, repeating the S22 to S25 until all the electrode lines on the substrate are coated with the anisotropic conductive agent.

Specifically, the pressure applied to the glue dispensing tank in S23 needs to be selected according to the quality of the conductive agent and the temperature of the working environment in order to avoid the phenomenon of two much glue due to two much pressure, or phenomenon of intermittent dispensing due to too little pressure.

It should be noted that since the anisotropic conductive agent is coated on the electrode line of the printed circuit board, or the anisotropic conductive agent is coated on two ends of the chip on film, its process operations are similar to that of coating the anisotropic conductive agent on the electrode line of the substrate, and will not be described here.

Figure 7:
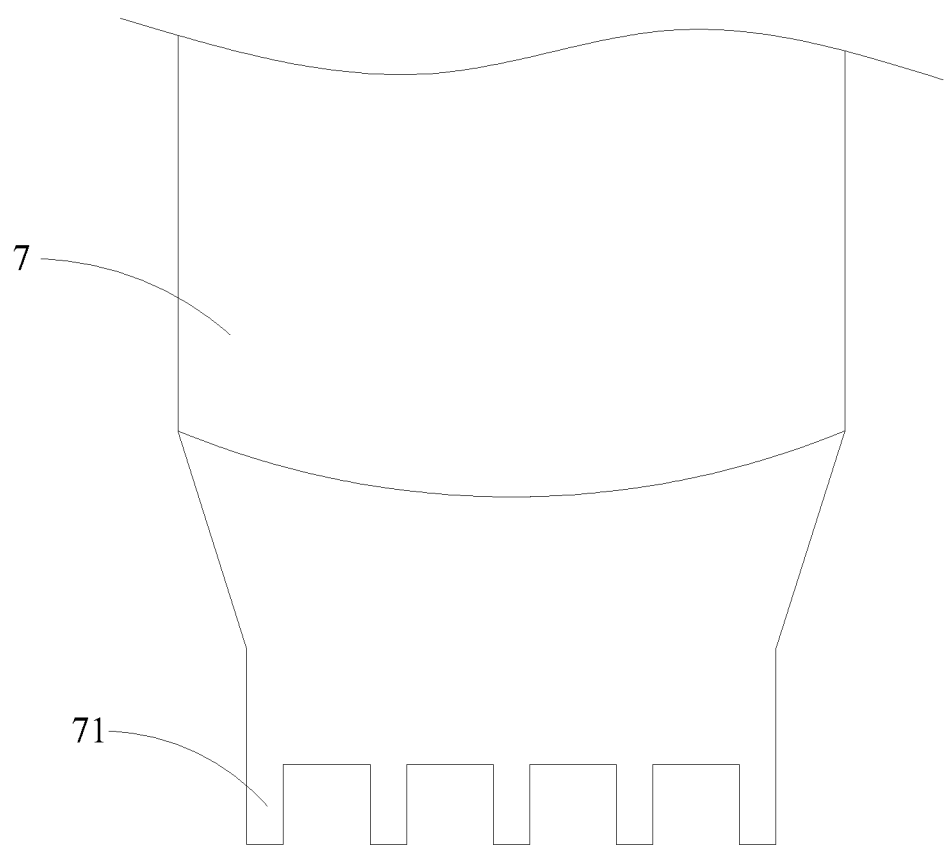
FIG. 7 is a structural diagram of the glue dispensing tank of the method for manufacturing the display panel of the present disclosure according to an embodiment.

As shown in FIG. 7, in some embodiments, the glue dispensing tank 7 of the glue dispenser (not shown) is provided with a plurality of glue outlets 71 in parallel. It can be understood that since the plurality of electrode lines are etched on either the substrate, the printed circuit board or the chip on film, the plurality of glue outlets 7 are provided on the glue dispensing tank 7, which can coat the plurality of electrode lines at one time, the working efficiency is effectively improved.

Furthermore, S3 includes curing the anisotropic conductive agent by the photo-curing mode. From the above, it can be seen that curing the anisotropic conductive agent by heat curing mode has many limitations and disadvantages, while curing the anisotropic conductive agent by photo-curing mode can correspondingly overcome the above disadvantages. Specifically, in some embodiments, the light source of the photo-curing mode is ultraviolet light (UV light), and in other embodiments, other light sources may be used to cure the anisotropic conductive agent.

It should be noted that the operation flow of the method for manufacturing the display panel given in some embodiments is only an exemplary embodiment of the present disclosure and is not a specific limitation on the manufacturing operations of the method for manufacturing the display panel of the present disclosure.

Furthermore, the time required to cure the anisotropic conductive agent is 2 seconds to 5 seconds.

It should be noted that when the curing time is insufficient, the anisotropic conductive agent cannot be completely cured, so that the bonding stability between the chip on film and the substrate, or between the chip on film and the printed circuit board cannot be guaranteed. When the curing time is too long, the toughness of the anisotropic conductive agent may be destroyed, and the stability of bonding between the chip on film and the substrate, or between the chip on film and the printed circuit board may also be affected. Therefore, setting the curing time as 2 seconds to 5 seconds is the most preferred solution. Specifically, in some embodiments, the curing time of the anisotropic conductive agent is 3 seconds, and in other embodiments, the curing time may also be 2 seconds, 4 seconds, or 5 seconds, etc.

The present disclosure also provides a display device, the display device includes a display panel, the detail structure of the display panel can be referred to the above embodiments. As the display device adopts all the technical proposals of the above embodiments, the display device at least has all of the beneficial effects of the technical proposals of the above embodiments, no need to repeat again.

The foregoing description merely depicts some embodiments of the present disclosure and therefore is not intended to limit the scope of the application. An equivalent structural or flow changes made by using the content of the specification and drawings of the present disclosure, or any direct or indirect applications of the disclosure on any other related fields shall all fall in the scope of the application.

What is claimed is:

1. A display panel, wherein, the display panel comprises:
a substrate, etching and forming a plurality of first electrode lines arranged in parallel;
a printed circuit board, etching and forming a plurality of second electrode lines arranged in parallel;
a chip on film, arranged above the substrate and the printed circuit board, and comprising a first bonding end corresponding to the first electrode line and a second bonding end corresponding to the second electrode line; and
an anisotropic conductive adhesive layer, connected between the first electrode line and the first bonding end, and between the second electrode line and the second bonding end.

2. The display panel according to claim 1, wherein the anisotropic conductive adhesive layer has a thickness of 5 micrometers and 10 micrometers.

3. The display panel according to claim 2, wherein the thickness of the anisotropic conductive adhesive is 8 micrometers.

4. The display panel according to claim 1, wherein the anisotropic conductive adhesive layer comprises a photo-curing agent.

5. The display panel according to claim 1, wherein the anisotropic conductive adhesive layer comprises a thermal curing agent.

6. A method for manufacturing display panel, comprising the following operations:
manufacturing colloidal anisotropic conductive agent;
coating the anisotropic conductive agent on each electrode line of a substrate and each electrode line of a printed circuit board through a glue coating mode, or coating the anisotropic conductive agent on two ends of a chip on film through a glue coating mode; and
pressing the two ends of the chip on film with the electrode lines of the substrate and the printed circuit board respectively, the operation of coating the anisotropic conductive agent on each electrode line of the substrate comprises the following operations:
placing the substrate on an operation platform;

driving a glue dispensing tank of a glue dispenser to be adjacent to one of the electrode lines on the substrate;

applying a pressure to the glue dispensing tank to make the anisotropic conductive agent flow out from a glue outlet of the glue dispensing tank;

moving the substrate at a constant speed along an extending direction of the electrode line until the electrode line of the substrate is coated with the anisotropic conductive agent;

releasing the pressure applied to the glue dispensing tank and driving the glue dispensing tank away from the electrode line; and repeating the above operations until all the electrode lines on the substrate are coated with the anisotropic conductive agent.

7. The method according to claim 6, wherein the operation of manufacturing colloidal anisotropic conductive agent comprises the following operations:

dissolving conductive particles, thermosetting resin and curing agent in a volatile solvent to obtain a conductive solution;

drying the conductive solution to obtain the anisotropic conductive agent having a certain viscosity and a colloidal shape.

8. The method according to claim 6, wherein through a spraying mode, coating the anisotropic conductive agent on each electrode line of the substrate and each electrode line of the printed circuit board, or coating the anisotropic conductive agent on two ends of the chip on film.

9. The method according to claim 6, wherein through a roller coating mode, coating the anisotropic conductive agent on each electrode line of the substrate and each electrode line of the printed circuit board, or coating the anisotropic conductive agent on two ends of the chip on film.

10. The method according to claim 6, wherein the glue dispensing tank defines a plurality of glue outlets in parallel.

11. The method according to claim 6, wherein the operation of pressing the two ends of the chip on film with the electrode lines of the substrate and the printed circuit board respectively, comprises curing the anisotropic conductive agent through a photo-curing method.

12. The method according to claim 11, wherein the time required to cure the anisotropic conductive agent by the photo-curing method is 2 seconds to 5 seconds.

13. The method according to claim 12, wherein the time required to cure the anisotropic conductive agent by the photo-curing method is 3 seconds.

14. A display device, wherein the display device comprises a display panel, the display panel comprises:

a substrate, etching and forming a plurality of first electrode lines arranged in parallel;

a printed circuit board, etching and forming a plurality of second electrode lines arranged in parallel;

a chip on film, arranged above the substrate and the printed circuit board, and comprising a first bonding end corresponding to the first electrode line, and a second bonding end corresponding to the second electrode line; and an anisotropic conductive adhesive layer, connected between the first electrode line and the first bonding end, and between the second electrode line and the second bonding end.

15. The display device accord to claim 14, wherein the anisotropic conductive adhesive layer has a thickness of 5 micrometers and 10 micrometers.

16. The display device accord to claim 15, wherein the thickness of the anisotropic conductive adhesive is 8 micrometers.

17. The display device accord to claim 14, wherein the anisotropic conductive adhesive layer comprises a photo-curing agent.

18. The display device of claim 14, wherein the anisotropic conductive adhesive layer comprises a thermal curing agent.

\* \* \* \* \*